(12) United States Patent
Miranda et al.

(10) Patent No.: US 6,570,825 B2
(45) Date of Patent: May 27, 2003

(54) METHOD AND CIRCUIT MODULE PACKAGE FOR AUTOMATED SWITCH ACTUATOR INSERTION

(75) Inventors: John Armando Miranda, Chandler, AZ (US); David Tapia Roman, Tempe, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/934,040

(22) Filed: Aug. 21, 2001

(65) Prior Publication Data

US 2003/0043551 A1 Mar. 6, 2003

(51) Int. Cl.[7] .............................. H05K 7/00; H05K 5/00
(52) U.S. Cl. ...................... 368/728; 361/732; 361/756
(58) Field of Search ................... 361/600–837; 200/43.01–43.22, 556–558, 564–566, 572

(56) References Cited

U.S. PATENT DOCUMENTS

| | | | | |
|---|---|---|---|---|
| 4,508,943 A | * | 4/1985 | Pfeiffer | 200/17 R |
| 4,532,419 A | | 7/1985 | Takeda | |
| 4,905,124 A | | 2/1990 | Banjo et al. | |
| 4,974,120 A | | 11/1990 | Kodai et al. | |
| 5,136,146 A | * | 8/1992 | Anglin | 235/441 |
| 5,560,999 A | * | 10/1996 | Pedicini | 429/27 |
| 5,574,309 A | | 11/1996 | Papapietro et al. | |
| 5,627,416 A | * | 5/1997 | Kantner | 307/119 |
| 5,703,346 A | * | 12/1997 | Bricaud | 235/441 |
| 5,742,479 A | | 4/1998 | Asakura | |
| 5,784,259 A | | 7/1998 | Asakura | |
| 5,822,190 A | | 10/1998 | Iwasaki | |
| 5,894,275 A | * | 4/1999 | Swingle | 340/692 |
| 6,040,622 A | | 3/2000 | Wallace | |
| 6,232,676 B1 | * | 5/2001 | Kozyra | 307/113 |
| D445,096 S | | 7/2001 | Wallace | |
| D446,525 S | | 8/2001 | Okamoto et al. | |

FOREIGN PATENT DOCUMENTS

| | | |
|---|---|---|
| JP | 3-112688 | 5/1991 |
| JP | 07017175 A | 1/1995 |
| JP | 08190615 A | 7/1996 |
| JP | 10-12646 | 1/1998 |
| JP | 10-334205 | 12/1998 |
| JP | 11-45959 | 2/1999 |

* cited by examiner

Primary Examiner—David Martin
Assistant Examiner—Michael L. Lindinger
(74) Attorney, Agent, or Firm—Jeffrey D. Moy; Harry M. Weiss; Weiss, Moy & Harris, P.C.

(57) ABSTRACT

A method and circuit module package for automated switch actuator insertion provides automated assembly of circuit modules having an integrated switch actuator, such as Secure Digital cards. A switch actuator is inserted automatically into a circuit module package housing by a robotic assembler. The housing and switch actuator have mating surfaces to retain the switch actuator within the housing so that shipping and subsequent assembly do not dislodge the switch actuator. The switch actuator/housing assembly can be contoured such that the switch actuator/housing assemblies may be stacked and then fed to a stack-loading feeder for joining of the actuator/housing assemblies to the remainder of the circuit module package housing. The switch actuator may be made from a material having a higher melting point than the housing so that ultrasonic welding may be performed on the circuit module package without joining the switch actuator permanently to the circuit module package assembly.

20 Claims, 3 Drawing Sheets

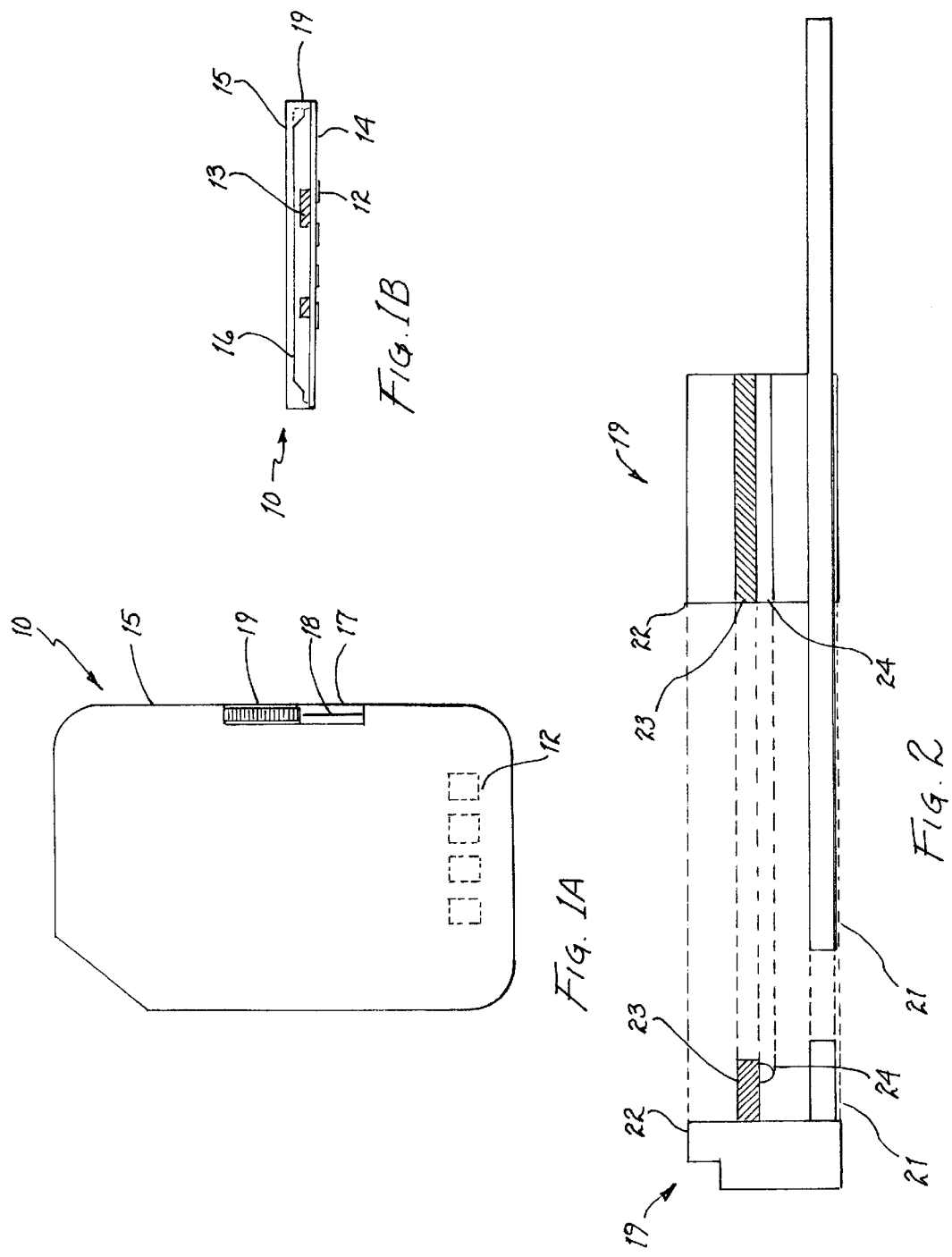

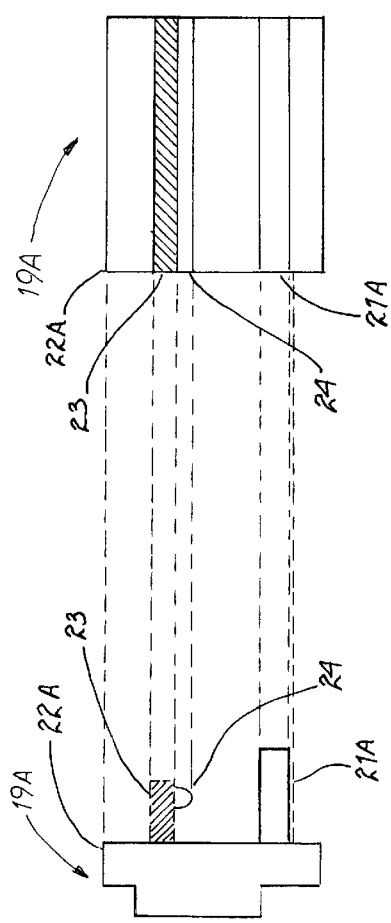
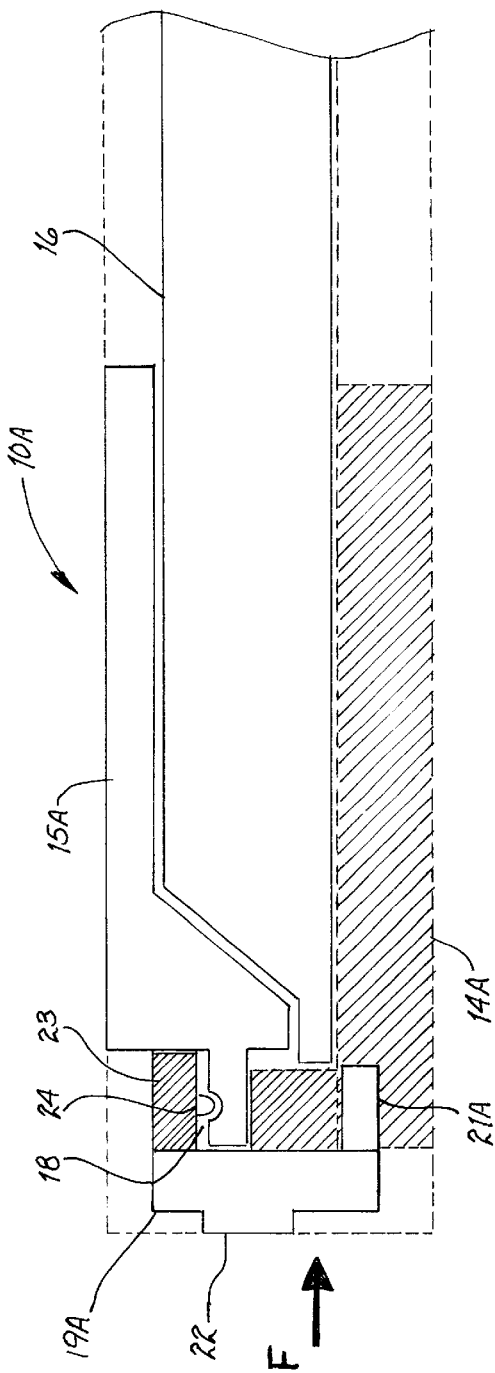

METHOD AND CIRCUIT MODULE PACKAGE FOR AUTOMATED SWITCH ACTUATOR INSERTION

FIELD OF THE INVENTION

The present invention relates generally to circuit module packaging, and more specifically, to a method and circuit module package for automated switch actuator insertion.

BACKGROUND OF THE INVENTION

Removable circuit modules or cards are increasing in use to provide storage and other electronic functions for devices such as digital cameras, personal computing devices and personal digital assistants (PDAs). Other memory cards uses include multi media cards and recently, secure digital (SD) cards.

SD cards require a movable switch actuator to activate a switch within mating receptacles for the SD cards. The switch actuator requirement typically dictates that a special housing be created that incorporates the switch actuator on the edge of the module housing.

Various solutions to switch actuator incorporation exist as write-protect switch actuators for SD card designs, such as metal clips that are attached after assembly of the SD card housings, plastic switch actuators that are manually inserted into a void in an SD card housing and plastic switch actuators that are manually inserted into the SD card housing prior to gluing the housing.

The assemblies are glued rather than ultrasonically welded to avoid welding the switch actuator to the housing, but care must also be taken to avoid gluing the switch actuator to the housing.

External metal actuators are not permitted in Secure Digital Card applications and manual placement of switch actuators is a time-consuming and error-prone process. Also, handling of the switch actuator component and housing assembly is complicated by designs wherein the actuator must be inserted prior to or after joining of the housing portions.

Therefore, it would be desirable to provide a circuit module package and method for automated switch actuator insertion whereby a circuit module housing may be integrated with a switch actuator prior to final assembly. It would further be desirable to provide a housing and switch actuator that may be assembled by ultrasonic welding without welding the switch actuator to the housing.

SUMMARY OF THE INVENTION

A method and circuit module package for automated switch actuator insertion provides automated assembly of circuit modules having an integrated switch actuator, such as Secure Digital cards. The circuit module package housing includes a channel for retaining the switch actuator during shipment of subassemblies and during the assembly of the final circuit module package. The switch actuator has a mating surface adapted to the surface of the channel within the housing, so that the switch is securely retained in the housing prior to assembly of the circuit module package.

BRIEF DESCRIPTION OF THE DRAWINGS

FIG. 1A is a pictorial diagram depicting a top view and FIG. 1B is a pictorial diagram depicting a cross section of a circuit module in accordance with an embodiment of the invention;

FIG. 2 is a pictorial diagram depicting a top view and a cross section of a switch actuator in accordance with an embodiment of the invention;

FIG. 4 is a pictorial diagram depicting a cross section of a switch actuator in accordance with an alternative embodiment of the invention; and FIG. 5 is a pictorial diagram depicting details of circuit module 10A of FIG. 4.

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

Figure 3:
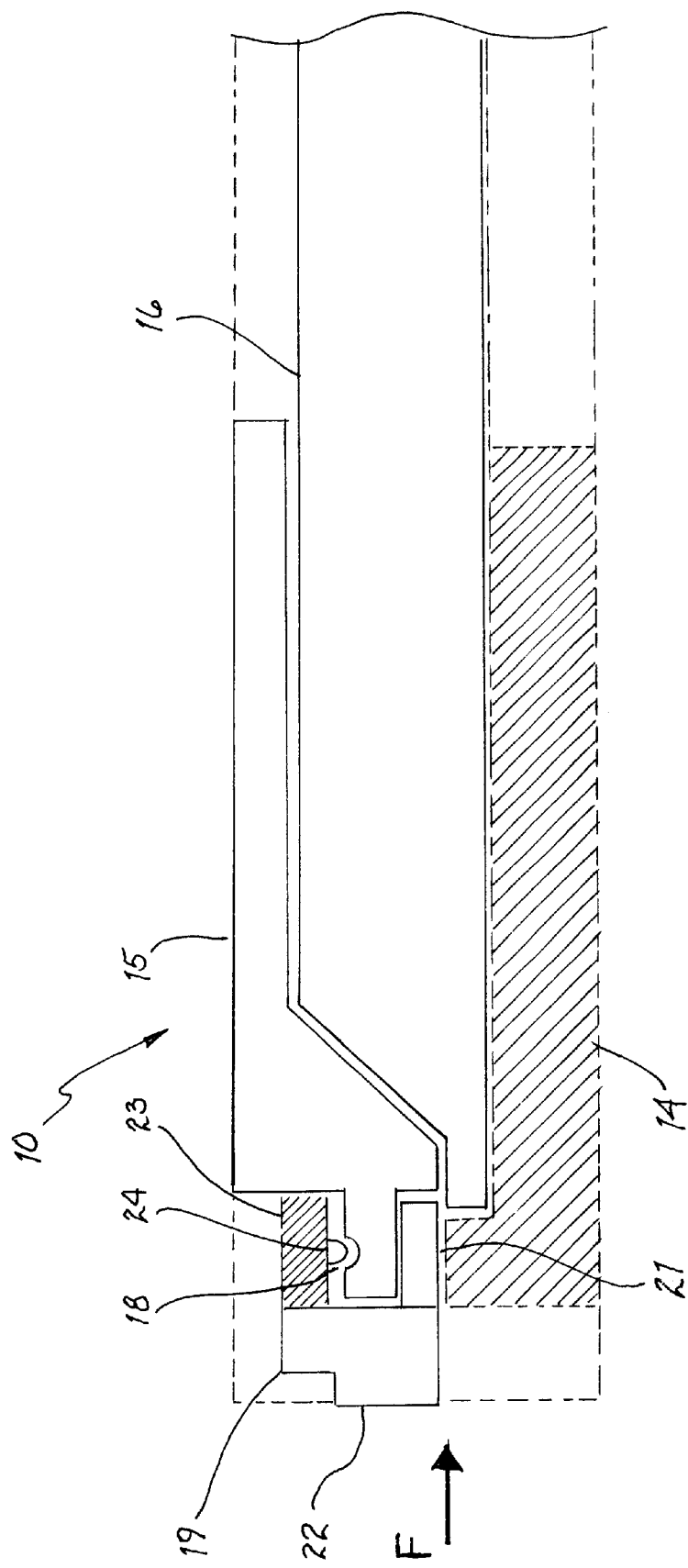
FIG. 3 is a pictorial diagram depicting details of circuit module 10 of FIGS. 1A and 1B.

Referring now to the figures and in particular to FIG. 1A and FIG. 1B, a circuit module 10 in accordance with an embodiment of the invention is depicted. Circuit module 10 is depicted as a circuit module as used in various multimedia memory applications and secure digital (SD card) applications.

The present invention is also applicable to cards and modules having other outlines such as multimedia cards, compact flash memory cards and other flash memory cards. The present invention applies to peripheral device cards (I/O cards), as well.

A housing bottom portion 14 holds a circuit assembly 16 which is generally one or mode integrated circuit dies 13 that are attached to a substrate and then encapsulated. Circuit contacts 12 are included on the bottom side of circuit assembly 16 and openings are provided for electrical contact through housing bottom portion 14. Circuit assembly 16 is covered by a housing top portion 15 that is bonded to housing bottom portion 14. A switch actuator 19 is attached to housing top portion 15, so that switch actuator 19 may slide within a recess 17. Switch actuator 19 is guided by a channel 18, that aids in retaining switch actuator 19 within housing top portion 15 prior to attachment of top portion 15 to housing bottom portion 14. Housing top portion 15 is generally attached to housing bottom portion by ultrasonic welding, which heats the housing portions to at or near the melting point of the material, joining housing top portion permanently to housing bottom portion 14, but other techniques may be used such as gluing without deviating from the scope of the present invention.

In order to perform ultrasonic welding joining the housing portions while switch actuator 19 is attached to housing top portion, switch actuator 19 should be made from a material having a higher melting point than the housing portions. For example, housing top portion 15 and bottom portion 14 may be made from a polycarbonate/Acrilonitrile Butadiene Styrene (PC/ABS), while the switch actuator 16 may be made from a semi-crystalline acetal resin such as CELCON. The result is that switch actuator 19 will not be distorted by the local heating produced by the ultrasonic welding and consequent joining of housing bottom portion 14 and housing top portion 15. Without the differing material properties, switch actuator 19 would have to be inserted after welding, otherwise the switch actuator may be permanently joined to the housing and immovable.

Table 1 comprises a list of suitable materials for the fabrication of switch actuator 19 and housing portions 14 and 15.

TABLE 1

| Housing portions (Amorphous Polymers) | Switch Actuator (Semi-crystalline Polymers) |
| --- | --- |
| ABS | Acetal |
| ABS/Polycarbonate Alloy | Cellulosics |
| Acrylic a | Fluropolymers |
| Acrylic multipolymer | Isonomer |
| Butadiene-Styrene | Liquid Crystal Polymers |
| Phenylene-oxide based resins | Nylon |
| Polyamide-imide | Polyester, thermoplastic |
| Polyarylate | Polyethylene terephthalate (PET) |
| Polycarbonate b | Polybutylene terephthalate (PBT) |
| Polyetherimide | Polyetheretherketone (PEEK) |
| Polyethersulfone b | Polyethylene |
| Polystyrene (general purpose) | Polymethylpentane |
| Polystyrene (rubber modified) | Polyphenylene sulfide |
| Polysulfone b | Polypropylene |
| PVC (rigid) | |
| SAN-NAS-ASA | |
| Xenoy (PBT/polycarbonate alloy) | |

The purpose of switch actuator 19 is to provide binary information such as write-protect enabled to an external switch mounted within a receptacle that receives the circuit module. In one position of the switch actuator, switch actuator 19 will contact an electrical switch lever within the receptacle and in the alternate position, switch actuator 19 will not contact the no electrical switch lever, providing two states of the information provided by switch actuator 19. Prior art implementations of switch actuators to perform this function must be: 1) inserted manually after ultrasonic welding of the housing portions, to avoid bonding of the switch actuator to the housing; 2) inserted manually prior to assembly of the housing, since there is no 3) mechanism to retain the switch actuator to a housing portion; clipped on to the exterior of the housing, which typically requires a metal component not permitted in Secure Digital (SD) applications; or 4) inserted manually after ultrasonic welding of the housing portions, since there is no mechanism to retain the switch actuator to the housing.

The present invention provides a mechanism for retaining switch actuator 19 within housing top portion 15 (alternatively the mechanism could be implemented within housing bottom portion 14 and switch actuator 19 retained by housing bottom portion 14). Switch actuator 19 is held securely after attachment to housing top portion 15 and may be handled in that configuration prior to final assembly of circuit module 10. The combination of housing top portion 15 and switch actuator 19 is designed so that the housing top portion/switch actuator assembly may be stacked for feeding to the final assembly stage by a stack loader. As depicted in the illustrative embodiment, this is accomplished by designing a switch actuator 19 that does not exceed the profile of housing top portion 15, but could be accomplished by contouring the bottom of housing top portion 15 in the region of recess 18 to accept the top of switch actuator 19.

Referring now to FIGS. 2A and 2B, a switch actuator in accordance with an embodiment of the invention is depicted. Switch actuator 19 has a handle 22 for moving the switch within recess 17 of FIG. 1 by a finger or a device such as a stylus to change the activation state of switch actuator 19. Attached to handle 22 are a lower slide 21 and an upper slide 23. Attached to upper slide is a protrusion 24 that mates with channel 18 of FIGS. 1A and 1B. Protrusion 24, retains switch actuator 19 to housing top portion 15 prior to final assembly of circuit module 10 of FIGS. 1A and 1B. By providing means for clipping switch actuator 19 to housing top portion 15, housing top portion/switch actuator assemblies may be easily transported.

Referring now to FIG. 3, details of the circuit module 10 depicted in FIGS. 1A and 1B are shown. Switch actuator 19 is fastened to housing top portion 15 by applying a slight force F in the direction shown, causing lower slide 21 and upper slide 23 to deform temporarily, permitting protrusion 24 to enter channel 18, which retains switch actuator 19 to housing top portion 15. A cut-out in housing top portion 15 receives lower slide 21, so that the bottom of lower slide 21 is conformal with the remainder of the edge of housing top portion 15.

Since handle 22 does not exceed the bottom profile of housing top portion 15, the assemblies may be shipped in a stacked configuration and may be fed to a stack loader for final assembly. Circuit assembly 16 is placed on housing bottom portion 14, and the switch actuator/housing top portion assembly is bonded to housing bottom portion over circuit assembly 16. If switch actuator 19 is made from a material having a higher melting point than the material forming housing top portion 15 and bottom portion 14, ultrasonic welding may be used to thermally bond the two housing portions without deforming or bonding switch actuator 19 to the housing.

Alternative retaining mechanisms may be used to attach switch actuator 19 to housing top portion 15 or housing bottom portion 14, such as a protrusion on housing top portion 15 replacing channel 18, with a mating channel in switch actuator 19 in place of protrusion 24. The shape of protrusion 24 and the do corresponding channel 18 shape may also be adapted to other outlines.

Referring now to FIG. 4, a switch actuator 19A in accordance with an alternative embodiment of the invention is depicted. The alternative embodiment depicted is adapted for attachment after the housing portions of a circuit module assembly have been welded or glued. Slider 21A extends only to the edges of switch actuator handle 22A and is inserted into the bottom of a circuit module housing.

Referring now to FIG. 5, details of a circuit module 10A, adapted for use with switch actuator 19A of FIG. 4 are depicted. Housing bottom portion 14A has a cut-out for slider 21A, rather than having a cut-out in the housing top portion of FIG. 3. Protrusion 24 and channel 18 are implemented as in the above-described embodiment and the switch is securely held to circuit module 10A by protrusion 24A. A protrusion could alternatively be used on slider 21A, with a corresponding mating channel in housing bottom portion 14A. The alternative embodiment of the invention permits secure attachment of switch actuator 19A subsequent to welding or gluing of the housing portions.

The above description of embodiments of the invention is intended to be illustrative and not limiting. Other embodiments of this invention will be obvious to those skilled in the art in view of the above disclosure and fall within the scope of the present invention.

What is claimed is:

1. A circuit module, comprising:
   at least one integrated circuit for providing an electronic function of the circuit module;
   a substrate for mounting the at least one integrated circuit within the circuit module;
   a switch actuator for activating an electronic switch when the circuit module is inserted within a receptacle;
   a first housing portion for covering a side of the substrate, including a recess for receiving a switch actuator, wherein the recess includes a mating surface on a inside region of a side of the housing portion for securely mating with a corresponding mating surface on the switch actuator; and a second housing portion attached to the first housing portion for covering a bottom side of the substrate.

2. The circuit module of claim 1, wherein the switch actuator comprises a protrusion on the switch actuator, and wherein the first housing portion includes a mating channel having a shape adapted to mate with the protrusion for retaining the switch actuator to the first housing portion.

3. The circuit module of claim 1 wherein the recess comprises a protrusion on the first housing portion, and wherein the switch actuator includes a mating channel having a shape adapted to mate with the protrusion for retaining the switch actuator to the first housing portion.

4. The circuit module of claim 1, wherein the switch actuator comprises a first slide for guiding the switch actuator within the recess.

5. The circuit module of claim 4, wherein the switch actuator further comprises a second slide for guiding the switch actuator, and wherein the first housing portion has a cutout for receiving the second slide.

6. The circuit module of claim 5, wherein the first slide comprises a protrusion on a lower surface of the first slide for retaining the switch actuator to the first housing portion, and wherein the first housing portion includes a mating channel having a shape adapted to mate with the protrusion.

7. The circuit module of claim 6, wherein the lower surface of the switch actuator is conformal to a lower surface of the first housing portion, so that multiple assemblies of the first housing portion and the switch actuator may be stacked prior to assembly of the circuit module.

8. The circuit module of claim 1, wherein the lower surface of the switch actuator is conformal to a lower surface of the first housing portion, so that multiple assemblies of the first housing portion and the switch actuator may be stacked prior to assembly of the circuit module.

9. A circuit module, comprising:

at least one integrated circuit for providing an electronic function of the circuit module;

a substrate for mounting the at least one integrated circuit within the circuit module;

a switch actuator for activating an electronic switch when the circuit module is inserted within a receptacle;

a first housing portion for covering a top side of the substrate, including means for securely mating with a corresponding mating surface on the switch actuator; and a second housing portion attached to the first housing portion for covering a bottom side of the substrate.

10. A switch actuator for a circuit module, comprising:

a handle for moving the switch actuator;

a mating surface for securely attaching the switch actuator to a side of a housing portion of the circuit module by mating with a corresponding mating surface of the housing portion.

11. The switch actuator of claim 10, further comprising a first slide adapted for guiding the switch actuator in a recess within the housing portion of the circuit module.

12. The switch actuator of claim 11, further comprising a second slide for guiding the switch actuator, wherein the second slide is adapted for insertion within a cutout in the housing portion.

13. The switch actuator of claim 12, wherein the first slide comprises a protrusion on a lower surface of the first slide for retaining the switch actuator to the first housing portion, and wherein the first housing portion includes a mating channel having a shape adapted to mate with the protrusion.

14. The switch actuator of claim 10 wherein the lower surface of the switch actuator is adapted for conformity with a lower surface of the housing portion, so that multiple assemblies of the housing portion and the switch actuator may be stacked prior to attachment of the switch actuator to a circuit module.

15. A circuit module, comprising:

means for providing an electronic function of the circuit module;

means for mounting the means for providing an electronic function within the circuit module;

means for activating an electronic switch when the circuit module is inserted within a receptacle;

a first housing portion which covers a top side of the means for mounting, including means for securely mating with a corresponding mating surface on the means for activating; and a second housing portion attached to the first housing portion for covering a bottom side of the means for mounting.

16. A circuit module in accordance with claim 15, wherein the means for activating comprises:

a handle for moving the means for activating; and means for securely attaching the means for activating to a side of the first housing portion.

17. A circuit module in accordance with claim 16, further comprising a first slide adapted to guide the means for activating in a recess within the first housing portion.

18. A circuit module in accordance with claim 17, further comprising a first slide adapted to guide the means for activating in a recess within the first housing portion.

19. A circuit module in accordance with claim 17, wherein the first slide comprises a protrusion on a lower surface of the first slide for retaining the means for activating to the first housing portion, and wherein the first housing portion includes a mating channel having a shape adapted to mate with the protrusion.

20. A circuit module in accordance with claim 17, wherein a lower surface of the means for activation is adapted for conformity with a lower surface of the first housing portion, so that multiple assemblies of the first housing portion and the means for activation may be stacked prior to assembly of the circuit module.

* * * * *